(12) United States Patent
Ryu

(10) Patent No.: US 7,400,088 B2
(45) Date of Patent: Jul. 15, 2008

(54) ORGANIC ELECTROLUMINESCENT DISPLAY DEVICE

(75) Inventor: Seoung-Yoon Ryu, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 247 days.

(21) Appl. No.: 11/185,850

(22) Filed: Jul. 21, 2005

(65) Prior Publication Data
US 2006/0017377 A1    Jan. 26, 2006

(30) Foreign Application Priority Data
Jul. 22, 2004    (KR) .................. 10-2004-0057383

(51) Int. Cl.
*H05B 33/00* (2006.01)
(52) U.S. Cl. ...................... 313/504; 313/506
(58) Field of Classification Search .......... 313/504, 313/506
See application file for complete search history.

(56) References Cited

U.S. PATENT DOCUMENTS

| 7,259,514    B2 * | 8/2007 | Murayama et al. .......... 313/506 |
| 2006/0145604 A1 * | 7/2006 | Liao et al. .................... 313/506 |

FOREIGN PATENT DOCUMENTS

| JP | 04-137485 | 5/1992 |
| JP | 04-328295 | 11/1992 |
| JP | 07-240277 | 9/1995 |
| JP | 2002305078 | 10/2002 |
| JP | 2003142277 | 5/2003 |
| JP | 2000-323277 | 11/2004 |
| KR | 1020030058155 | 7/2003 |
| KR | 102004000630 | 1/2004 |
| KR | 1020050014437 | 2/2005 |
| KR | 1020050051061 | 6/2005 |

\* cited by examiner

*Primary Examiner*—Ashok Patel
(74) *Attorney, Agent, or Firm*—H.C. Park & Associates, PLC

(57) ABSTRACT

The present invention discloses organic electroluminescent display device and a method for fabricating the same, which includes: a first hole transporting layer formed in the first, second, and third pixel regions; a second hole transporting layer formed on a portion of the first hole transporting layer in the second and third pixel regions; a third hole transporting layer formed on a portion of the second hole transporting layer in the third pixel region. Light emitting layers are formed on each of the first, second, and third hole transporting layers. The thickness of the second hole transporting layer is approximately one-third ($\frac{1}{3}$) to two-thirds ($\frac{2}{3}$) of an optical wavelength difference between the first and second pixel regions, and the thickness of the third hole transporting layer is approximately one-third ($\frac{1}{3}$) to two-thirds ($\frac{2}{3}$) of an optical wavelength difference between the second and third pixel regions.

18 Claims, 4 Drawing Sheets

ORGANIC ELECTROLUMINESCENT DISPLAY DEVICE

CROSS-REFERENCE TO RELATED APPLICATION

This application claims the benefit of Korean Patent Application No. 2004-57383, filed on Jul. 22, 2004, the disclosure of which is hereby incorporated in its entirety by reference herein.

BACKGROUND OF THE INVENTION

1. Field of the Invention

The present invention relates to an organic electroluminescent display device and a method of fabricating the same and, more particularly, to an organic electroluminescent display device having an optimum resonance structure.

2. Description of the Related Art

An organic electroluminescent display ("OLED") device having a thin film transistor ("TFT") is a self light-emissive type display device, which is attracting public attention as a next generation display device because of its wide viewing angle, excellent contrast ratio, and fast response speed.

The OLED device is classified as either an inorganic electroluminescent (EL) device or an organic EL device depending on the material used to form a light emitting layer. Compared to the inorganic EL device, the organic EL device may provide improved display performance in such characteristics as luminance, driving voltage, response speed, and can also provide a full-color display.

The OLED device has a full color feature because it may include a pixel comprising pixel regions defined by the intersection of a plurality of scan lines and a plurality of data lines, which can be arranged substantially perpendicular to each other. Each pixel region corresponds to either red, green, or blue colors.

Referring to FIG. 1, a typical full-color OLED device has a substrate 10 having a red pixel region (R), a green pixel region (G) and a blue pixel region (B); and a plurality of first electrodes 12 formed on portions of substrate 10 overlapping the red pixel region, the green pixel region and the blue pixel region. In the case of a top-emission type OLED device, the first electrode 12 can be a metal electrode, which may be either a reflecting electrode or a transparent electrode containing a reflecting layer.

In order to insulate the pixel regions and to define the pixel, an insulating material layer is deposited and patterned to form a pixel defining layer 14.

A hole injecting layer 16 and a hole transporting layer 18 are formed over the whole surface of substrate 10 to cover the first electrodes 12 as a common layer.

A light emitting material layer is deposited on portions of hole transporting layer 18 that overlap the respective pixel regions to thereby form red (R), green (G) and blue (B) light emitting layers 20.

If needed, a hole blocking layer 21, an electron transporting layer 22, and an electron injecting layer 23 are sequentially formed over the whole surface of substrate 10, and a second electrode layer 24 is formed on electron injecting layer 23. In a typical OLED, hole injecting layer 16, hole transporting layer 18, light emitting layer 20, hole blocking layer 21, electron transporting layer 22, and electron injecting layer 23 are thin films made of an organic compound.

In a typical full-color OLED device, there is generally differences in luminous efficiency between respective pixel regions, i.e., the respective colors. For example, a green light emitting material has a higher luminous efficiency than red and blue light emitting materials, and a red light emitting material has a higher luminous efficiency than a blue light emitting material.

As a result, much research has been performed to obtain maximum luminous efficiency and luminance by controlling the thickness of organic thin films. For example, Japanese Published Application No. 4-137485 discloses a technique for improving luminous efficiency by forming the electron transporting layer of a thickness between 30 to 60 nm on a structure that an anode, a hole transporting layer, a light emitting layer, an electron transporting layer, and a cathode are sequentially formed.

Japanese Published Application No. 4-328295 discloses a technique of substantially increasing luminance by controlling the thickness of the electron transporting layer such that the light generated from the light emitting layer interferes with the light reflected from the cathode. Also, Japanese Published Application No. 7-240277 discloses an OLED device that controls an optical film thickness to improve luminance, particularly the color purity of blue light.

The OLED devices described above provide different optical film thicknesses for each color to thereby improve luminance. However, it is very difficult to form optical films of different thicknesses by using different manufacturing processes for each color.

SUMMARY OF THE INVENTION

It is an object of the present invention to provide an OLED device that has optimum resonance structures for respective R, G and B pixel regions and a method of fabricating the same.

The present invention discloses an organic electroluminescent display device including: a substrate having first, second, and third pixel regions; a plurality of first electrodes formed on the substrate in each of the first to third pixel regions; a hole injecting layer formed on the substrate to cover the first electrodes; a first hole transporting layer formed on the hole injection layer in the first, second, and third pixel regions; a second hole transporting layer formed on a portion of the first hole transporting layer in the second and third pixel regions; a third hole transporting layer formed on a portion of the second hole transporting layer in the third pixel region; first, second, and third light emitting layers formed on the first, second, and third hole transporting layers, respectively; and a second electrode formed on the first, second, and third light emitting layers, wherein a thickness of the second hole transporting layer is one-third (⅓) to two-thirds (⅔) of an optical wavelength difference between the first and second pixel regions, and a thickness of the third hole transporting layer is one-third (⅓) to two-thirds (⅔) of an optical wavelength difference between the second and third pixel regions.

The present invention further discloses an organic electroluminescent display device including first, second, and third pixel regions, each pixel region having a lower electrode and an organic light emitting layer. The difference between a distance from the lower electrode to the organic light emitting layer in one pixel region and a distance from the lower electrode to the organic light emitting layer in an adjacent pixel region is one-third (⅓) to two-thirds (⅔) of an optical wavelength difference between the adjacent two pixel regions.

The present invention discloses a method for fabricating an organic electroluminescent display device including: preparing a substrate; forming a plurality of first electrodes on the substrate; forming a pixel defining layer on the substrate to cover the first electrodes; patterning the pixel defining layer to expose a light emitting region, thereby defining light emitting regions in each of a first, second, and third pixel region; forming a hole injecting layer on the substrate; forming a first hole transporting layer on the hole injecting layer; forming a second hole transporting layer on the first hole transporting layer in the second and third pixel regions; forming a third hole transporting layer on the second transporting layer in the third pixel region; patterning first, second, and third light emitting material layers on the respective first, second, and third hole transporting layers to form first, second, and third light emitting layers in the respective first, second, and third pixel regions; and forming a second electrode on the first, second, and third light emitting layers. A thickness of the second hole transporting layer is one-third (⅓) to two-thirds (⅔) of an optical wavelength difference between the first and second pixel regions, and a thickness of the third hole transporting layer is one-third (⅓) to two-thirds (⅔) of an optical wavelength difference between the second and third pixel regions.

In an alternative method for fabricating an organic electroluminescent display device, the method includes forming the first hole transporting layer and then forming the first light emitting material layer; forming the second hole transporting layer and then forming the second light emitting material layer; and forming the third transporting layer and then forming the third light emitting material layer.

BRIEF DESCRIPTION OF THE DRAWINGS

The features and advantages of the present invention will become more apparent to those of ordinary skill in the art when describing in detail embodiments thereof with reference to the attached drawings.

DETAILED DESCRIPTION OF THE INVENTION

Figure 1:
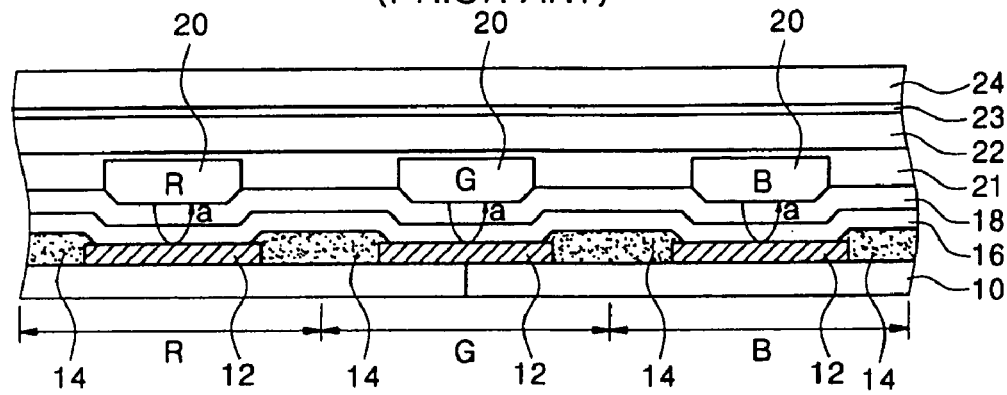
FIG. 1 is a cross-sectional view illustrating a typical full-color OLED device.

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, film, region or substrate is referred to as being "on" another element, it can be directly on the other element or intervening elements may also be present. In contrast, when an element is referred to as being "directly on" another element, there are no intervening elements present. Like numbers refer to like elements throughout the specification.

Figure 2:
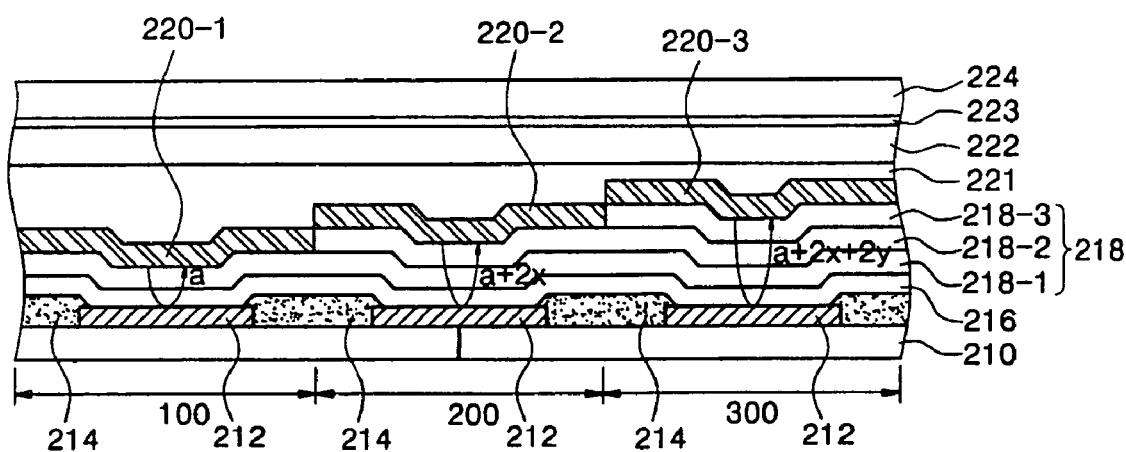
FIG. 2 is a cross-sectional view illustrating an OLED device according to an embodiment of the present invention.

Referring to FIG. 2, the OLED device of the present invention may include: a substrate 210 having a first pixel region 100, a second pixel region 200, and a third pixel region 300; and a plurality of first electrodes 212 formed on portions of the substrate 210 in each of pixel regions 100, 200, 300.

Pixel regions 100, 200, 300 implement different colors, which may correspond to red, green, or blue. For example, assuming that first pixel region 100 is red and second pixel region 200 is green, then third pixel region 300 is blue. Further, assuming that first pixel region 100 is green and second pixel region 200 is blue, then third pixel region 300 is red.

Preferably, first pixel region 100 is blue, the second pixel region 200 is green, and the third pixel region 300 is red. But the invention is not limited to such an arrangement of the pixel regions that comprise a pixel.

A transparent insulating substrate such as a glass substrate or a plastic substrate may be used for substrate 210.

The plurality of first electrodes 212 may be reflecting electrodes. The reflecting electrode can be made from a group comprising aluminum (Al), aluminum alloy, a dual-layered reflecting anode which contains indium tin oxide (ITO) or indium zinc oxide (IZO) and silver (Ag), and a triple-layered electrode that contains Ag and ITO.

Subsequently, a pixel defining layer 214 is deposited on first electrodes 212. Pixel defining layer 214 is patterned to include an opening portion corresponding to a light emitting region. Pixel defining layer 214 may be formed of an organic insulating layer such as benzo-cylo-butene (BCB) or acrylic resin.

Then, a hole injecting layer 216 is formed on first electrode layer 212. Hole injecting layer 216 may be formed over the whole surface of substrate 210 as a common layer to cover the respective pixel regions 100, 200, 300. Hole injecting layer 216 may be made of a typical hole injecting layer material such as copper phthalocyanine (CuPc) or 4,4',4"-tris(N-3-methylphenyl-N-phenylamino)-triphenylamine (mTDATA).

A first hole transporting layer 218-1 is formed over the whole surface of substrate 210 to cover hole injecting layer 216. First hole transporting layer 218-1 may be formed as a common layer. First hole transporting layer 218-1 may have a thickness between 300-500 Å or the total thickness of both hole injecting layer 216 and first hole transporting layer 218-1 may be between 1,300-1,500 Å.

A second hole transporting layer 218-2 is formed using a fine metal mask on portions of the first hole transporting layer 18-1 overlapping second and third pixel regions 200, 300.

A third hole transporting layer 218-3 is formed again using a fine metal mask on a portion of the first hole transporting layer 218-1 overlapping third pixel region 300. As a result, hole transporting layer 218 is formed having portions of different thicknesses overlapping each of the pixel regions 100, 200, 300.

Red, green, and blue light have different wavelengths at maximum intensity. For example, at maximum intensity, blue light has a wavelength of approximately 460 nm, green light has a wavelength of approximately 520 nm, and red light has a wavelength of approximately 630 nm. At this time, if both an optical path (e.g., "a" in first pixel region 100) and an optical thickness (e.g., "a/2" in first pixel region 100) between first electrode 12 and the light emitting layer 20 are identical for the respective colors but there is a difference in a moving distance of light according to the wavelength for each color, optimum optical characteristics cannot be obtained.

Therefore, by providing differing optical thicknesses between a first electrode and a light emitting layer for each color to account for wavelength differences between the respective colors at a maximum intensity, an optimum optical resonance structure can be obtained.

To acheive an optimum optical resonance structure, a difference between optical paths (i.e., optical thicknesses) between first electrodes 212 and light emitting layers 220-1, 220-2 in the adjacent two pixel regions 100, 200 is set to one-third (⅓) to two-thirds (⅔) of the wavelength difference of the colors at maximum intensity for each pixel region. In FIG. 2, the differences in optical paths between pixel regions 100, 200 is set at one-half (½) the wavelength difference at maximum intensity For example, as shown in FIG. 2, assuming that a difference between the wavelengths of the colors at maximum intensity for the first and second pixel regions 100, 200 is 2x, then a difference between the optical path from first electrode 212 to light emitting layer 220-1 in first pixel region 100 and an optical path from first electrode 212 to light emitting layer 220-2 in second pixel region 200 is set to 2x. Thus, if the optical path of the first pixel region 100 is "a", then the optical path of the second pixel region 200 is set to "a+2x." Therefore, a difference between the optical thickness of first pixel region 100 and second pixel region 200 becomes "x" to provide the optical path "a+2x" in second pixel region 200.

Accordingly, if the thickness second hole transporting layer 218-2 is set to "x", the optimum optical resonance structure can be obtained. The value of "x" may be between 300-500 Å or the total thickness of both hole injecting layer 216 and the first and second hole transporting layers 218-1, 218-2 may be between 1,300-1,500 Å.

Further, assuming that a difference between a wavelengths of the colors at maximum intensity for the second and third pixel regions 200, 300 is 2y, then a difference between the optical path from first electrode 212 to light emitting layer 220-2 in second pixel region 200 and an optical path from first electrode 212 to light emitting layer 220-3 in third pixel region 300 is 2y. Thus, if third transporting layer 218-3 is formed at the thickness of "y" to provide the optical path "a+2x+2y" in third pixel region 300, then the optimum optical resonance structure can be obtained. The value of "y" may be between 300 Å-500 Å or the total thickness of the hole injecting layer 216 and first, second, and third hole transporting layers 218-1, 218-2, 218-3 may be between 2,100-2,300 Å.

The embodiment described above illustrated an optical thickness difference of one-half (½) the wavelength difference of the colors at maximum intensity for adjacent pixel regions, but the OLED device having the optimum resonance structure can be manufactured using a varying thicknesses from approximately one-third (⅓) to two thirds (⅔) of this wavelength difference.

Second and third hole transporting layers 218-2, 218-3 can be formed on the respective pixel regions 200, 300 separately, but to simplify the manufacturing process second transporting layer 218-2 may be formed as a common layer overlapping both second and third pixel regions 200, 300.

Here, first, second, and third hole transporting layers 218-1, 218-2, 218-3 may be made of N,N'-di(1-naphthyl)-N,N'-diphenyl-benzidene (NPD) or polyethylenethioxythiophene (PEDOT). In addition, each hole transporting layer 218-1, 218-2, 218-3 may be made of different materials from one another.

The thickness of first hole transporting layer 218-1 is set to satisfy the device characteristics for the respective pixel regions. Using blue as an example, if hole injecting layer 216 has thickness of 1,000 Å, then the thickness of first hole transporting layer 218-1 may be 300-500 Å. Since the optimum efficiency of blue light is at a wavelength of approximately 460 nm, i.e., 4,600 Å, an optimum efficiency can be obtained, due to constructive interference, when the total thickness of hole injecting layer 216 and hole transporting layer 218-1 is around 1,300 Å, which in consideration of the optical path is closest to one-half the wavelength of blue light.

First, second, and third light emitting material layers may be deposited on hole transporting layer 218 and then patterned to form respective first, second, and third light emitting layers 220-1, 220-2, 220-3. In the described embodiment, first, second, and third pixel regions 100, 200, 300 correspond to red, green and blue colors to implement the full-color OLED device. However, if device characteristics such as luminous efficiency are considered, the red pixel region may have the thickest hole transporting layer because red has the longest wavelength, the green pixel may have the next thickest hole transporting layer because green has the next longest wavelength, and blue subpixel may have the least thick hole transporting layer because blue has the shortest wavelength.

Therefore, for achieving optimal luminous efficiency, a blue light emitting layer 220-1 may be formed in first pixel region 100, a green light emitting layer 220-2 may be formed in second pixel region 200, and a red light emitting layer 220-3 may be formed in third pixel region 300.

The red light emitting layer contains carbazole biphenyl (CBP) or 1,3-dicarbazole-benzene (mCP) as a host material and a phosphorescent material which contains at least one dopant material selected from a group comprised of PQIr (acac)(bis(1-phenylquinoline)-acetylacetonate-iridium), PQIr (tris(1-phenylquinoline) iridium), and PtOEP (platinum-octaethylporphyrin). Also, the red light emitting layer may be made of a fluorescent material such as $Eu(DBM)_3$ (Phen):PBD or Perylene.

The green light emitting layer contains CBP or mCP as a host material and contains a phosphorescent material which contains $Ir(ppy)_3$ (fac tris(2-phenylpyridine) iridium) as a dopant material. The green light emitting layer may be made of a fluorescent material such as $Alq_3$ (aluminum-tris(8-hydroxyquinolino)).

The blue light emitting layer is made of a fluorescent material which may contain one of the following: DPVBi, spiro-DPVBi, spiro-6P, distyrylbenzene (DSB), distyrylarylene (DSA), PFO-based polymer, and PPV-based polymer. The blue light emitting layer can be made from one of the fluorescent materials listed above instead of a phosphorescent material to improve the stability of optical characteristics.

The light emitting layer may be formed using known techniques such as a laser induced thermal imaging (LITI), an ink jet method, a vacuum deposition method, or any other suitable technique for forming such a layer.

Second electrode layer 24 may be formed of a transmissive metal electrode such as Ca, Ca/Ag, or Mg/Ag.

The OLED device of the present invention may further include at least one of the following: hole blocking layer 221, electron transporting layer 222, and electron injecting layer 223.

Hole blocking layer 221 may be made of bis(2-methyl-8-quinolinolate)-(4-hydroxy-biphenylyl)-aluminum (BAlq); hole transporting layer 22 may be made of polycyclic hydrocarbon-like derivative, heterocyclic compound, or tris(8-quinolitorato)-aluminum ($Alq_3$); and electron injecting layer 23 may be made of LiF, Liq, NaF or Naq.

Moreover, a passivation layer (not shown) may further be formed on second electrode layer 24. The passivation layer may be made of $SiN_x$ or $SiO_2$.

Figure 3:
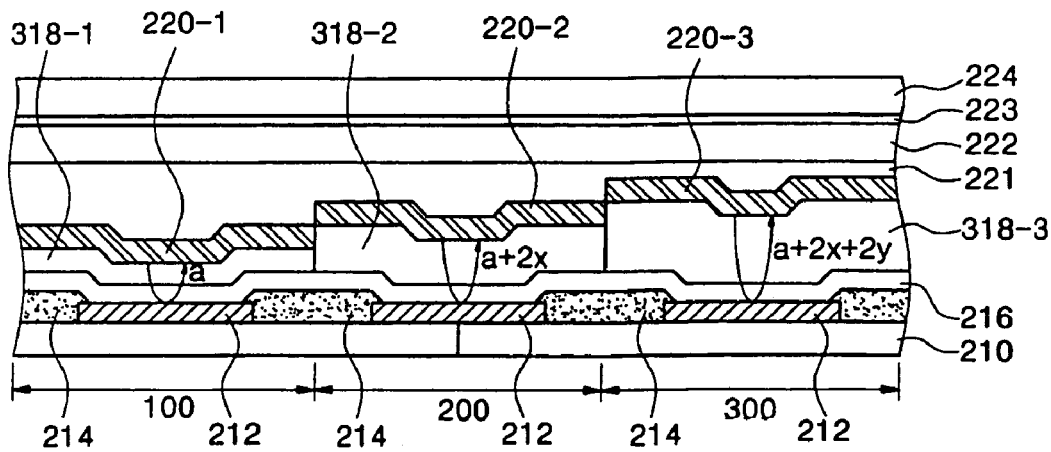
FIG. 3 is a cross-sectional view illustrating an OLED device according to another embodiment of the present invention.

Referring to FIG. 3, the OLED device according to another embodiment of the present invention is arranged in as similar manner as the OLED illustrated in FIG. 2.

Unlike the previous embodiment, however, the hole transporting layers of different thicknesses are formed individually in each pixel region. For example, a first hole transporting layer 318-1 is formed on the portion of hole injecting layer 216 disposed in only first pixel region 100.

Subsequently, a second hole transporting layer 318-2 is formed only in second pixel region 200, and thereafter a third hole transporting layer 318-3 is formed only in third pixel region 300.

In the previous embodiment, the hole transporting layer 218 is formed of overlapping multiple layers 218-1, 218-2, 218-3, but the hole transporting layer of another embodiment of the present invention is formed such that one layer 318-1, 318-2, 318-3 is formed in each of the pixel regions 100, 200, 300, respectively.

As in the previous embodiment, the first, second, and third hole transporting layers may be made of different materials from one another.

Also, after depositing the hole transporting layers 318-1, 318-2, 318-3, red, green, and blue light emitting materials may be deposited using a fine metal mask to form light emitting layers 220-1, 220-2, 220-3. Alternatively, each light emitting layer may be deposited directly after its corresponding hole transporting layer is deposited. For example, a blue light emitting layer 220-1 may be deposited using a fine metal mask directly after depositing first hole transporting layer 318-1, a green light emitting layer 220-2 may be deposited directly after depositing second hole transporting layer 318-2, and then a red light emitting layer 220-3 may be deposited directly after depositing third hole transporting layer 318-3.

The below manufacturing examples are to describe a method for manufacturing an OELD device with red, green and blue light emitting layers according to the present invention.

MANUFACTURING EXAMPLE R1

A reflective pixel electrode is prepared such that a substrate (aluminum and ITO) (available from SDI company) having a thickness of 1,300 Å is cut to have a size of 50 mm×50 mm×0.7 mm, is ultrasonic-cleaned in Isopropyl alcohol and pure water during five minutes respectively and then is ultraviolet and ozone-cleaned during thirty minutes.

A hole injecting layer having a thickness of 1,000 Å is formed on the pixel electrode by using m-TDATA which is a hole injecting material, and a hole transporting layer having a thickness of 1,200 Å is formed on the hole injecting layer using a NPB which is a hole transporting material.

A red light emitting layer having a thickness of 300 Å is formed on the hole transporting layer using CBP and BPTIr as a red light emitting material, and a hole blocking layer having a thickness of 50 Å is formed by depositing Balq on the red light emitting layer. Alq3 is deposited at a thickness of 250 Å on the hole blocking layer to form an electron transporting layer, and Lif is deposited at a thickness of 3 Å on the electron transporting layer to form an electron injecting layer. Finally, a transparent opposite electrode is formed at a thickness of 180 Å using MgAg, thereby manufacturing the OELD device. The OELD device manufactured by the manufacturing example R1 is referred to as Sample R1.

MANUFACTURING EXAMPLE R2

A manufacturing method of the manufacturing example R2 is the same as that of the manufacturing example R1 except that the hole transporting layer is formed at a thickness of 1,000 Å. The OELD device manufactured by the manufacturing example R2 is referred to as Sample R2.

MANUFACTURING EXAMPLE R3

A manufacturing method of the manufacturing example R3 is the same as that of the manufacturing example R1 except that the hole transporting layer is formed at a thickness of 1,400 Å. The OELD device manufactured by the manufacturing example R3 is referred to as Sample R3.

MANUFACTURING EXAMPLE R

A manufacturing method of the manufacturing example R is the same as that of the manufacturing example R1 except that the hole transporting layer is formed at a thickness of 800 Å. The OELD device manufactured by the manufacturing example R2 is referred to as Sample R.

MANUFACTURING EXAMPLE G1

A manufacturing method of the manufacturing example G1 is the same as that of the manufacturing example R1 except that NPB as a hole transporting material is deposited at a thickness 800 Å to form the hole transporting layer and CBP and Irppy as a green light emitting material are deposited at 300 Å to form a green light emitting layer instead of the red light emitting layer. The OELD device manufactured by the manufacturing example G1 is referred to as Sample G1.

MANUFACTURING EXAMPLE G2

A manufacturing method of the manufacturing example G2 is the same as that of the manufacturing example G1 except that the hole transporting layer is formed at a thickness of 600 Å. The OELD device manufactured by the manufacturing example G2 is referred to as Sample G2.

MANUFACTURING EXAMPLE G3

A manufacturing method of the manufacturing example G3 is the same as that of the manufacturing example G1 except that the hole transporting layer is formed at a thickness of 900 Å. The OELD device manufactured by the manufacturing example G3 is referred to as Sample G3.

MANUFACTURING EXAMPLE G

A manufacturing method of the manufacturing example G is the same as that of the manufacturing example G1 except that the hole transporting layer is formed at a thickness of 500 Å. The OELD device manufactured by the manufacturing example G is referred to as Sample G.

MANUFACTURING EXAMPLE B1

A manufacturing method of the manufacturing example B1 is the same as that of the manufacturing example R1 except that NPB as a hole transporting material is deposited at a thickness 400 Å to form the hole transporting layer and IDE140 (available from Idemistu company) and IDE105 (available from Idemistu company) as a blue light emitting material is deposited at 150 Å to form a blue light emitting layer instead of the red light emitting layer. The OELD device manufactured by the manufacturing example B1 is referred to as Sample B1.

MANUFACTURING EXAMPLE B2

A manufacturing method of the manufacturing example B2 is the same as that of the manufacturing example B1 except that the hole transporting layer is formed at a thickness of 300 Å. The OELD device manufactured by the manufacturing example B2 is referred to as Sample B2.

MANUFACTURING EXAMPLE B3

A manufacturing method of the manufacturing example B3 is the same as that of the manufacturing example B1 except that the hole transporting layer is formed at a thickness of 500 Å. The OELD device manufactured by the manufacturing example B3 is referred to as Sample B3.

MANUFACTURING EXAMPLE B

A manufacturing method of the manufacturing example B is the same as that of the manufacturing example B1 except that the hole transporting layer is formed at a thickness of 200 Å. The OELD device manufactured by the manufacturing example B is referred to as Sample B.

EVALUATUION EXAMPLE1

Evaluation of Efficiency a Color Coordinate and Power Consumption of Samples Obtained From the Above-Described Manufacturing Examples Performance of the samples described above has been evaluated. Efficiency and a color coordinate of Samples R1, R2, R3, and R and Samples G1, G2, G3, and G have been evaluated and are shown in FIGS. 4 to 7. Efficiency and color purity have been measured using the IVL measuring device (PhotoResearch PR650, Keithley 238).

Figure 8:
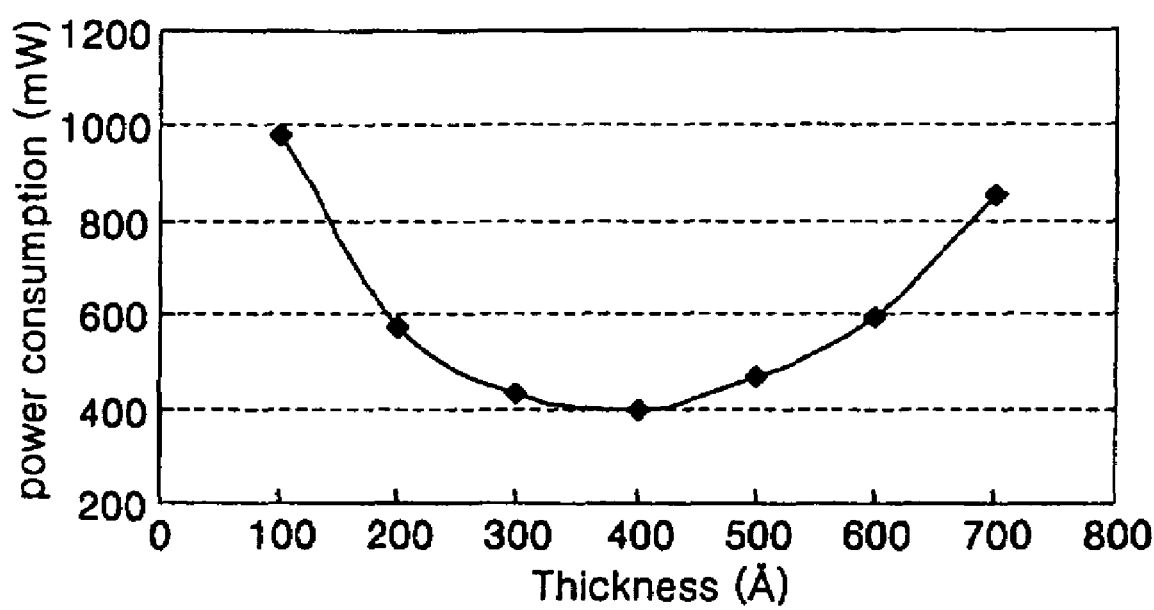
FIG. 8 is a graph of power consumption of a blue color OLED device according to third embodiment of the present invention.

Performance of Samples B1, B2, B3, and B has been evaluated by measuring power consumption of respective samples, and the result is shown in FIG. 8. In case of blue color emission, the color coordinate variation sensitively affects the whole power consumption and thus has been evaluated using power consumption measured in consideration of both the coordinate and efficiency. The power consumption has been calculated after evaluating the efficiency and the color purity using the IVL measuring device (PhotoResearch PR650, Keithley 238).

In FIGS. 4 to 8, an x-axis denotes a thickness of the hole transporting layer of respective samples.

Figure 4:
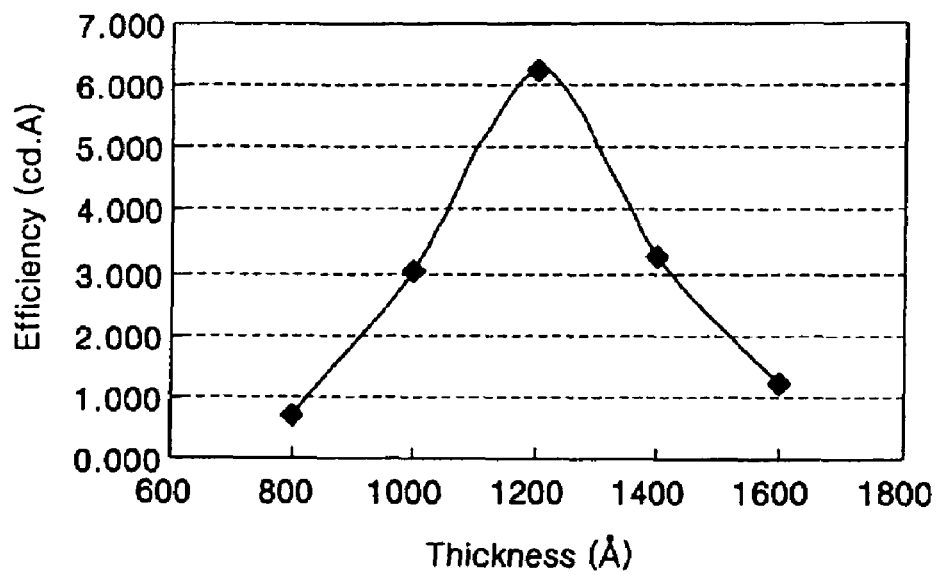
FIG. 4 and FIG. 5 are graphs of an efficiency and a color coordinate of a red color OLED device according to first embodiment of the present invention.
Figure 7:
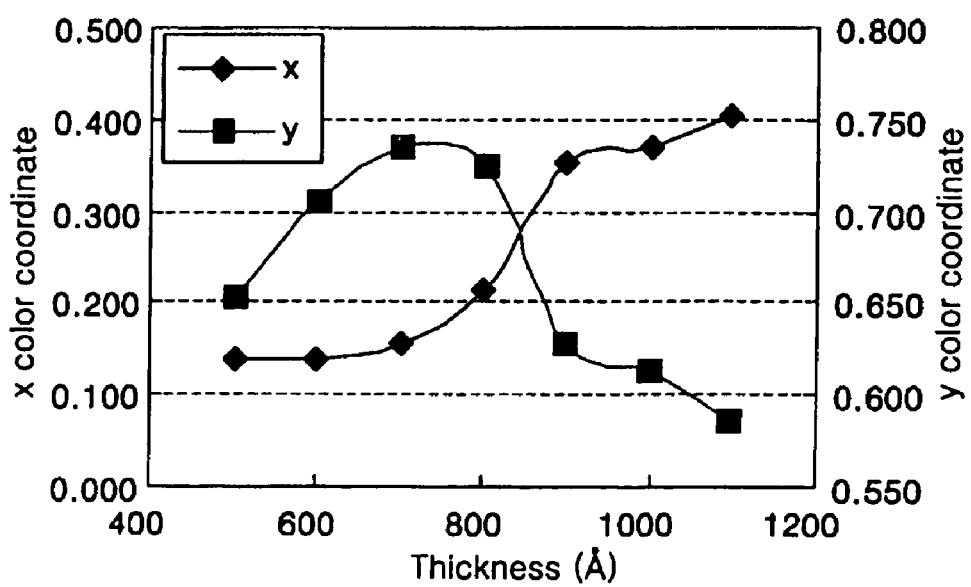

FIG. 4 is a graph illustrating efficiencies of Samples R1, R2, R3, and R. As shown in FIG. 7, the efficiency of Sample R does not reach even 1, but the efficiency of Sample R1 is more than 6, and thus it can be understood that Sample R1 has very high efficiency.

Figure 5:
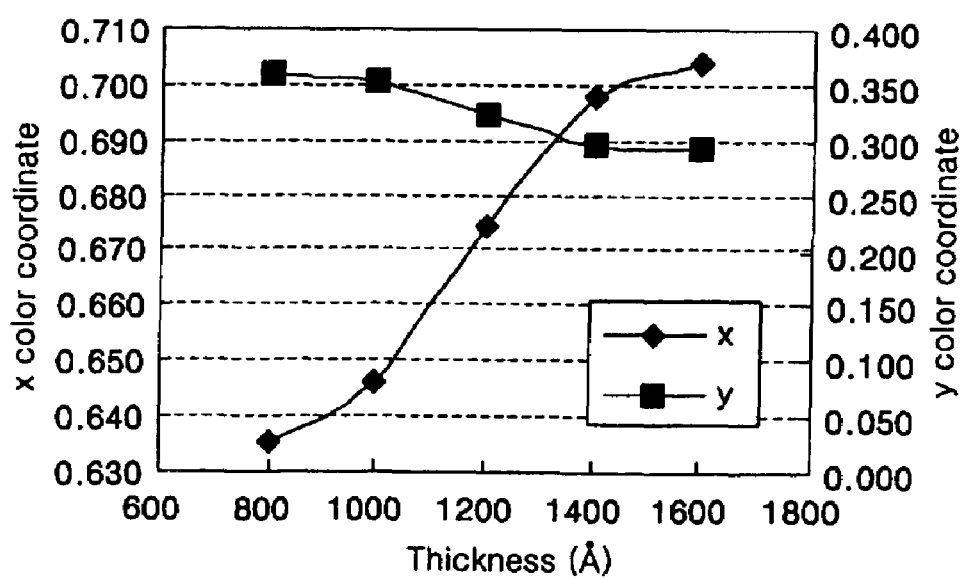

FIG. 5 is a graph illustrating color coordinates of Samples R1, R2, R3, and R. Since a NTSC level of the red is (0.67, 0.32), the color coordinate of Sample R is (0.635, 0.36) which does not reach the red NTSC level, but the color coordinate of Sample R1 is (0.672, 0.32), and thus it can be understood that Sample R1 has very excellent color coordinate.

Figure 6:
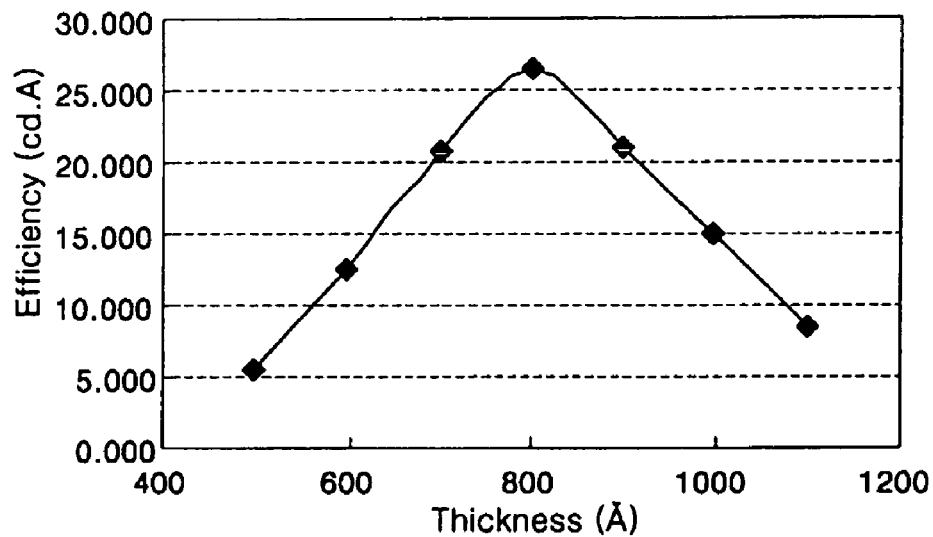
FIG. 6 and FIG. 7 are graphs of an efficiency and a color coordinate of a green color OLED device according to second embodiment of the present invention.

FIG. 6 is a graph illustrating efficiencies of Samples G1, G2, G3, and G.

As shown in FIG. 9, the efficiency of Sample G is just 5, but the efficiency of Sample G1 is about 25 which is five times as high as that of Sample 5, and thus it can be understood that Sample G1 has very high efficiency.

FIG. 7 is a graph illustrating color coordinates of Samples G1, G2, G3, and G. Since a NTSC level of the green is (0.21, 0.71), the color coordinate of Sample G is (0.14, 0.65) which does not reach the red NTSC level, but the color coordinate of Sample G1 is (0.21, 0.726), and thus it can be understood that Sample G1 has very excellent color coordinate.

FIG. 8 is a graph illustrating power consumption of Samples B1, B2, B3, and B. As shown in FIG. 8, Sample B has power consumption of 570 mW which is very high, but Sample B1 has just power consumption of about 400 mW, and thus it can be understood that Sample B1 has very excellent power consumption.

EMBODIMENT 1

This embodiment describes a method for manufacturing an OELD device which has all of red, green and blue light emitting layers as an OELD device which is optimized in thickness of the hole injecting layer and the hole transporting layer.

A substrate having a thin film transistor (TFT) is prepared, and a pixel electrode made of aluminum is formed at a thickness 1,000 Å in the form of stripe. Here, the pixel electrode is formed to be electrically connected to source and drain electrodes of the TFT arranged on the lower substrate.

A pixel defining layer which defines regions on which red, green and blue light emitting layers are to be formed is formed on the pixel electrode using a silicon oxide material. Then, m-TDATA as a hole injecting material is deposited at a thickness of 1,000 Å to form the hole injecting layer. NPB as a hole transporting material is deposited at a thickness of 400 Å to form the hole transporting layer. Using a photo mask, NPB is additionally deposited at a thickness of 400 Å on the region on which the green light emitting layer is to be formed, and NPB is additionally deposited at a thickness of 800 Å on the region on which the red light emitting layer is to be formed, so that a thickness of the hole transporting layer corresponding the red light emitting region is 1,200 Å, a thickness of the hole transporting layer corresponding the green light emitting region is 800 Å, and a thickness of the hole transporting layer corresponding the blue light emitting region is 400 Å.

On the hole transporting layer, CBP and BTPIr as a red light emitting material are formed at a thickness of 300 Å, CBP and Irppy as a green light emitting material are formed at a thickness of 300 Å, and IDE140 (available from Idemistu company) and IDE105 (available from Idemistu company) as a blue light emitting material are formed at a thickness of 150 Å.

Balq is deposited on the light emitting layer to form the hole blocking layer of a thickness of 50 Å. Alq3 is formed on the hole blocking layer at a thickness of 250 Å to form the electron transporting layer, and LiF is formed on the electron transporting layer at a thickness of 3 Å. Then, Mg:Ag is formed at a thickness of 180 Å as the transparent opposite electrode, whereby manufacturing the OELD device.

Evaluation 2

Performance Evaluation of the OELD Device of Embodiment 1

Voltage, current, luminance, efficiency, and color coordinate of the OELD device manufactured by Embodiment 1 have been evaluated by the same method of Evaluation Example 1. The result is shown in Table 1.

TABLE 1

|  | Voltage (V) | Current (mA/cm2) | luminance (cd/m2) | Efficieny (cd/A) | x color coordinate | y color coordinate |
| --- | --- | --- | --- | --- | --- | --- |
| Red light emitting layer | 8.17 | 37.19 | 2000 | 5.39 | 0.67 | 0.32 |
| Green light emitting layer | 6.56 | 16.40 | 4000 | 24.45 | 0.21 | 0.72 |
| Blue light emitting layer | 6.36 | 42.92 | 600 | 1.40 | 0.14 | 0.06 |

As can be seen Table 1, the OELD device of Embodiment 1 is excellent in luminance, efficiency and color coordinate for respective color light emitting layers.

EMBODIMENT 2

This embodiment describes a method for manufacturing a flat panel display device which has two or more OELD devices to display through both sides.

A transparent substrate which has first and second display regions and a thin film transistor is prepared. A first OELD device is formed on the first display region of the substrate in the same way as Embodiment 1. A second OELD device which has layered structure of Table 2 below is formed on a surface corresponding to the surface on which the first OELD device is formed, thereby manufacturing the flat panel display device which can display through both sides. That is, the first OELD device is a front light emitting type which has a reflective pixel electrode and a transparent opposite electrode, whereas the second OELD device is a bottom light emitting type which has a transparent pixel electrode and a reflective opposite electrode.

TABLE 2

|  | Red light emitting region | Green light emitting region | Blue light emitting region |
|---|---|---|---|
| Pixel electrode | ITO 1500☐ | ITO 1500☐ | ITO 1500☐ |
| Hole transporting layer | NPB(500☐) | NPB(500☐) | NPB(500☐) |
| Light emitting layer host | CBP(300☐) | CBP(300☐) | IDE140(200☐) |
| Light emitting layer dopant | BTPIr(10 weight %) | Ir(ppy)3 (5 weight %) | IDE105(5 weight %) |
| Hole blocking layer | Balq(50☐) | Balq(50☐) | Balq(50☐) |
| Electron transporting layer | Alq3(200☐) | Alq3(200☐) | Alq3(200☐) |
| Electron injecting layer | LiF(10☐) | LiF(10☐) | LiF(10☐) |
| Opposite electrode | Al(3000☐) | Al(3000☐) | Al(3000☐) |

EVALUATUION EXAMPLE3

Performance Evaluation of the Flat Panel Display Device of Embodiment 2

Voltage, current, luminance, efficiency, and color coordinate of the first and second OELD devices of the flat panel display device of Embodiment s have been evaluated by the same method of Evaluation Example 1. Performance evaluation result of the first OELD device is the same as that of Table 1, and performance evaluation result of the second OELD device is shown in Table 3.

TABLE 3

|  | Voltage (V) | Current (mA/cm$^2$) | Luminance (cd/m$^2$) | Efficiency (cd/A) | x color coordinate | y color coordinate |
|---|---|---|---|---|---|---|
| Red light emitting layer | 6.803 | 12.779 | 600 | 4.712 | 0.677 | 0.320 |
| Green light emitting layer | 6.641 | 3.516 | 1000 | 28.518 | 0.316 | 0.619 |
| Blue light emitting layer | 6.142 | 14.020 | 700 | 4.986 | 0.148 | 0.152 |

As can be seen in Tables 2 and 3, the flat panel display device which can display through both sides has excellent performance.

As described herein, according to the present invention, the hole transporting layer may have different thicknesses according to the color implemented by each pixel region, and, thus, provides a full-color OLED device with an optimum resonance structure.

What is claimed is:

1. An organic electroluminescent display device, comprising:
   a substrate including a first pixel region, a second pixel region, and a third pixel region;
   a plurality of first electrodes formed on the substrate in each of the first, second, and third pixel regions;
   a hole injecting layer formed on the substrate to cover the plurality of first electrodes;
   a first hole transporting layer formed on the hole injecting layer in the first, second, and third pixel regions;
   a second hole transporting layer formed on a portion of the first hole transporting layer in the second and third pixel regions;
   a third hole transporting layer formed on a portion of the second hole transporting layer in the third pixel region;
   a first light emitting layer formed on the first hole transporting layer;
   a second light emitting layer formed on the second hole transporting layer;
   a third light emitting layer formed on the third hole transporting layer; and
   a second electrode formed on the first, second, and third light emitting layers,
   wherein a thickness of the second hole transporting layer is approximately one-third (⅓) to two-thirds (⅔) of an optical wavelength difference between the first pixel region and the second pixel region, and the thickness of the third hole transporting layer is approximately one-third (⅓) to two-thirds (⅔) of an optical wavelength difference between the second pixel region and the third pixel region.

2. The device of claim 1, wherein the thickness of the second hole transporting layer is approximately one-half (½) of an optical wavelength difference between the first pixel region and the second pixel region, and the thickness of the third hole transporting layer is approximately one-half (½) of an optical wavelength difference between the second pixel region and the third pixel region.

3. The device of claim 1, wherein each of the first, second, and third pixel regions implement different colors, which correspond to red, green or blue.

4. The device of claim 3, wherein the first pixel region corresponds to blue, the second pixel region corresponds to green, and the third pixel region corresponds to red.

5. The device of claim 4, wherein the first and second pixel regions are adjacent to each other, and the second and third pixel regions are adjacent to each other.

6. The device of claim 1, wherein a thickness of the first hole transporting layer is between approximately 300 Å and 500 Å, and a total of the hole injecting layer and the first hole transporting layer is between approximately 1,300 Å and 1,500 Å.

7. The device of claim 5, wherein the thickness of the second hole transporting layer is between approximately 300 Å and 500 Å, and a total thickness of the hole injecting layer and the first hole transporting layer, and the second hole transporting layer is between approximately 1,700 Å and 1,900 Å.

8. The device of claim 5, wherein the thickness of the third hole transporting layer is between approximately 300 Å and 500 Å, and a total thickness of the hole injecting layer, the first hole transporting layer, the second hole transporting layer, and the third hole transporting layer is between approximately 2,100 Å and 2,300 Å.

9. The device of claim 1, wherein each of the first, second, and third hole transporting layers are made of different materials from one another.

10. The device of claim 1, wherein two of the first, second, and third hole transporting layers are made of the same material.

11. The device of claim 1, wherein the first, second, and third hole transporting layers are made of the same material.

12. The device of claim 1, wherein the first hole transporting layer is formed as a common layer.

13. The device of claim 1, wherein at least one of the first electrodes is a reflecting electrode, and the second electrode is a transparent electrode.

14. The device of claim 1, wherein at least one of the first electrodes is a transparent electrode containing a reflecting layer, and the second electrode is a transmissive metal electrode.

15. The device of claim 14, wherein the transmissive metal electrode includes at least one material from the group consisting of Ca, Ca/Ag, and Mg/Ag.

16. The device of claim 1, further comprising:
   at least one layer of a hole blocking layer, an electron transporting layer and an electron injecting layer formed on the first, second, and third light emitting layer.

17. The device of claim 1, further comprising:
   a passivation layer formed on the second electrode layer.

18. The device of claim 1, wherein the first, second, and third hole transporting layers are each made of a material from the group consisting of N,N'-di(1-naphthyl)-N,N'-diphenyl-benzidene (NPD) and polyethylenethioxythiophene (PEDOT).

* * * * *